(12) United States Patent
Moriwaki et al.

(10) Patent No.: US 6,750,718 B2
(45) Date of Patent: Jun. 15, 2004

(54) RADIO-FREQUENCY AMPLIFIER

(75) Inventors: Takao Moriwaki, Tokyo (JP); Kousei Maemura, Tokyo (JP)

(73) Assignee: Mitsubishi Denki Kabushiki Kaisha, Tokyo (JP)

(*) Notice: Subject to any disclaimer, the term of this patent is extended or adjusted under 35 U.S.C. 154(b) by 0 days.

(21) Appl. No.: 10/304,079

(22) Filed: Nov. 26, 2002

(65) Prior Publication Data

US 2004/0004518 A1 Jan. 8, 2004

(30) Foreign Application Priority Data

Jul. 3, 2002 (JP) .................................... 2002-195075

(51) Int. Cl.⁷ .............................................. H03G 3/10
(52) U.S. Cl. ...................................... 330/285; 330/296
(58) Field of Search ................................ 330/285, 296, 330/288, 307–315, 316

(56) References Cited

U.S. PATENT DOCUMENTS 6,313,705 B1 * 11/2001 Dening et al. .............. 330/276
6,333,677 B1 * 12/2001 Dening ...................... 330/296
6,369,657 B2 * 4/2002 Dening et al. .............. 330/296

FOREIGN PATENT DOCUMENTS

JP  5-145349  6/1993

* cited by examiner

Primary Examiner—Henry Choe
(74) Attorney, Agent, or Firm—Leydig, Voit & Mayer, Ltd.

(57) ABSTRACT

Base biases that are supplied to an RF transistor when the RF transistor is in high output power operation and in low output power operation, respectively, are supplied from different voltage sources. When an amplifier is in high output power operation, a base bias is output from a bias circuit unit. At this time, the RF transistor operates at a constant voltage based on the bias that is output from the bias circuit unit. When the amplifier is in low output power operation, a base bias is supplied from a reference voltage terminal via a resistor. This makes it possible to decrease variation in base bias voltage. When the amplifier is in low output power operation, operation of the bias circuit unit is prohibited and hence no current is consumed in the bias circuit unit, whereby efficiency of the amplifier is increased.

6 Claims, 4 Drawing Sheets

RADIO-FREQUENCY AMPLIFIER

BACKGROUND OF THE INVENTION

1. Field of the Invention

The present invention relates to a radio-frequency amplifier. In particular, the invention relates to a radio-frequency amplifier in a transmission power amplifier for a CDMA modulation type portable terminal.

2. Background Art

In recent years, small information terminals (hereinafter referred to as "portable terminals") such as cellular phones and PDAs have spread. In portable terminals, amplifiers having high power consumption efficiency are now required. Among multiple access schemes employed by cellular phones is a code division multiple access (CDMA) modulation scheme that is based on a spread spectrum technique. In transmission power amplifiers for CDMA modulation type portable terminals, not only the power load efficiency at the time of high output power but also the efficiency at the time of low output power is important because a power control is performed during a communication. Therefore, conventionally, in such amplifiers, switching is made between bias settings for high output power and low output power.

FIG. 4 shows a conventional power amplifier 60 with a bias circuit having a bias setting switching function. In FIG. 4, reference numeral 1 denotes a radio-frequency (RF) transistor; 7, a terminal of a collector voltage source for the RF transistor 1; 3, a bias circuit unit for supplying a base bias to the RF transistor 1; and 2, a bias switching circuit unit for switching between bias settings. In the bias circuit unit 3, reference numeral 10 denotes a transistor Q1; 6, a terminal of a bias circuit voltage source Vcb that is connected to the collector of the transistor Q1 (10); 8, a resistor R1 that is provided between the emitter of the transistor Q1 (10) and the ground GND; 5, a terminal of a reference voltage Vref; 9, a resistor R2 that is provided between the terminal 5 of the reference voltage Vref and the base of the transistor Q1 (10); and 23 and 24, transistors that are provided between the base of the transistor Q1 (10) and the ground GND. In the bias switching circuit unit 2, reference numeral 11 denotes a transistor Q2; 21, a resistor that is provided between the collector of the transistor Q2 (11) and the base of the RF transistor 1; 4, a bias switching MOD terminal; and 22, a resistor that is provided between the base of the transistor Q2 (11) and the bias switching MOD terminal 4.

Next, an operation of the conventional amplifier 60 will be described with reference to FIG. 4. When the amplifier 60 is in high output power operation, the bias switching MOD terminal 4 receives an off-voltage (0 V) and hence the transistor Q2 (11) of the bias switching circuit unit 2 is turned off. As a result, the voltage that is output from the bias circuit unit 3 is supplied to the RF transistor 1 without modification. The base bias that is supplied to the RF transistor 1 at this time is set so that an output power distortion characteristic that is required for the amplifier 60 in high output power operation is satisfied with a sufficient margin.

On the other hand, when the amplifier 60 is in low output power operation, the bias switching MOD terminal 4 is given an on-voltage (3 V) and hence the transistor Q2 (11) of the bias switching circuit unit 2 is turned on. As a result, a current flows through the bias switching circuit unit 2 and the base bias of the RF transistor 1 is lowered. When the amplifier 60 is in low output power operation, even if the base bias of the RF transistor 1 is lowered, the amplifier 60 operates in a linear range and hence its distortion characteristic should be satisfactory. The above-described bias switching function can increase efficiency at the time of low output power when the amplifier 60 operates in a linear range.

As described above, in the conventional bias circuit having the function of switching the base bias of the RF transistor 1, the base bias that is set by the bias circuit unit 3 is subjected to switching of the bias switching circuit unit 2. This causes a problem that a variation in the idle current of the RF transistor 1 strongly depends on a variation in the bias voltage that is output from the bias circuit unit 3. When the amplifier 60 is in low output power operation, its efficiency strongly depends on the idle current of the RF transistor 1, to increase the efficiency of the amplifier 60 and thereby it is necessary to accurately set the bias that is output from the bias circuit unit 3. When the amplifier 60 is in low output power operation, a current of about 100 mA flows through it and hence a current of about 5 mA is consumed in the bias circuit unit 3. There is a problem that this current greatly influences the efficiency of the amplifier 60.

SUMMARY OF THE INVENTION

The present invention has been achieved to solve the above problems and an object of the invention is therefore to provide a radio-frequency amplifier capable of increasing its efficiency by decreasing a variation in the idle current of an RF transistor.

According to one aspect of the present invention, a radio-frequency amplifier is provided for amplifying a radio-frequency signal. The radio-frequency amplifier comprises a radio-frequency transistor, a reference voltage supply unit for supplying a first base bias from a reference voltage source to a base of the radio-frequency transistor via a first resistor, and a bias circuit unit for outputting a second base bias to the base of the radio-frequency transistor. The bias circuit unit comprises a switching terminal that provides a signal that serves to switch outputting the second base bias or not. The radio-frequency transistor performs a constant voltage operation and the radio-frequency amplifier produces a high output power when the bias circuit unit outputs the second base bias. The radio-frequency transistor performs a constant current operation and the radio-frequency amplifier produces a low output power when the bias circuit unit does not output the second base bias.

Other and further objects, features and advantages of the invention will appear more fully from the following description.

DETAILED DESCRIPTION OF THE PREFERRED EMBODIMENTS

Embodiments of the present invention will be hereinafter described in detail with reference to the accompanying drawings.

First Embodiment

Figure 1:
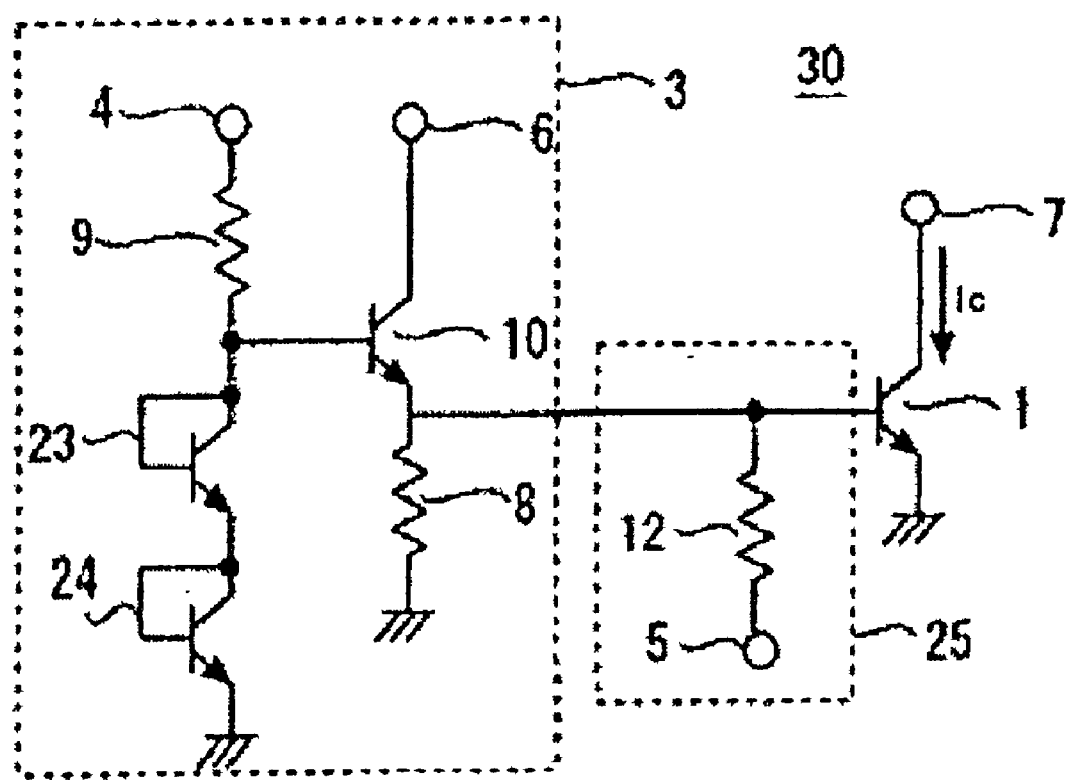
FIG. 1 shows a power amplifier according to a first embodiment of the invention.

FIG. 1 shows a power amplifier 30 according to a first embodiment of the invention. In FIG. 1, reference numeral 1 denotes an RF transistor; 7, a terminal of a collector voltage source for the RF transistor 1; 3, a bias circuit unit for supplying a base bias to the RF transistor 1; and 25, a reference voltage supply unit for supplying a reference voltage. In the reference voltage supply unit 25, reference numeral 5 denotes a terminal of a reference voltage Vref and numeral 12 denotes a resistor R3 that is provided between the terminal 5 of the reference voltage Vref and the base of the RF transistor 1. In the bias circuit unit 3, reference numeral 10 denotes a transistor Q1; 6, a terminal of a bias circuit voltage source Vcb that is connected to the collector of the transistor Q1 (10); 8, a resistor R1 that is provided between the emitter of the transistor Q1 (10) and the ground GND; 4, a bias switching MOD terminal (switching terminal) for switching of a bias setting; 9, a resistor R2 that is provided between the bias switching MOD terminal 4 and the base of the transistor Q1 (10); and 23 and 24, transistors that are provided between the base of the transistor Q1 (10) and the ground GND. As shown in FIG. 1, the reference voltage terminal 5 that supplies the reference voltage Vref is connected to the base of the RF transistor 1 with the only intervention of the resistor R3 (12). The bias switching MOD terminal 4 for switching of a bias setting is provided at the position where the reference voltage Vref is supplied in the conventional bias circuit unit 3.

Next, the operation of the amplifier 30 shown in FIG. 1 will be described. In the amplifier 30, the base bias of the RF transistor 1 is switched between low output power operation and high output power operation as the voltage at the bias switching MOD terminal 4 is switched. For example, the reference voltage Vref at the reference voltage terminal 5 is set at about 2.6 V in the case where the RF transistor 1 is an AlGaAs HBT. By adjusting the resistance of the resistor R3 (12), the bias that is supplied from the reference voltage terminal 5 via the resistor R3 (12) is set lower than the bias that is output from the bias circuit unit 3. Where the reference voltage Vref at the reference voltage terminal 5 is set at 2.6 V, the resistance of the resistor R3 (12) is made approximately equal to that of the resistor R1 (8) of the bias circuit unit 3.

When the amplifier 30 is in high output power operation, the bias switching MOD terminal 4 is given an on-voltage (3 V) and hence the bias circuit unit 3 outputs a base bias for the RF transistor 1. At this time, the bias voltage that is supplied from the reference voltage terminal 5 via the resistor R3 (12) is lower than the bias voltage that is output from the bias circuit unit 3. Therefore, the RF transistor 1 performs a constant voltage operation based on the bias that is output from the bias circuit unit 3. This bias is set so that an output power distortion characteristic that is required for the amplifier 30 in high output power operation is satisfied with a sufficient margin.

On the other hand, when the amplifier 30 is in low output power operation, the bias switching MOD terminal 4 is given an off-voltage (0 V) and hence no bias voltage to be supplied to the base of the RF transistor 1 is output from the bias circuit unit 3. Since the bias circuit unit 3 does not operate, the efficiency of the amplifier 30 is increased. The base bias for the RF transistor 1 is supplied from the reference voltage terminal 5 via the resistor R3 (12). At this time, the RF transistor 1 performs a constant current operation and the base bias is supplied to the RF transistor 1 irrespective of a variation in the bias of the bias circuit unit 3. Therefore, a variation in the idle current of the RF transistor 1 can be suppressed.

As described above, according to the first embodiment, the base biases that are supplied to the RF transistor 1 when it is in high output power operation and in low output power operation, respectively, can be supplied from the different voltage sources. When the amplifier 30 is in high output power operation, a base bias is output from the bias circuit unit 3. Since the bias voltage that is supplied from the reference voltage terminal 5 via the resistor R3 (12) is lower than the bias voltage that is output from the bias circuit unit 3, the RF transistor 1 performs a constant voltage operation based on the bias that is output from the bias circuit unit 3. This bias is set so that an output power distortion characteristic that is required for the amplifier 30 in high output power operation is satisfied with a sufficient margin. When the amplifier 30 is in low output power operation, the base bias for the RF transistor 1 is supplied from the reference voltage terminal 5 via the resistor R3 (12). This makes it possible to decrease a variation in base bias voltage. When the amplifier 30 is in low output power operation, operation of the bias circuit unit 3 is prohibited and hence no current is consumed in the bias circuit unit 3, whereby the efficiency of the amplifier 30 can be increased.

Second Embodiment

Figure 2:
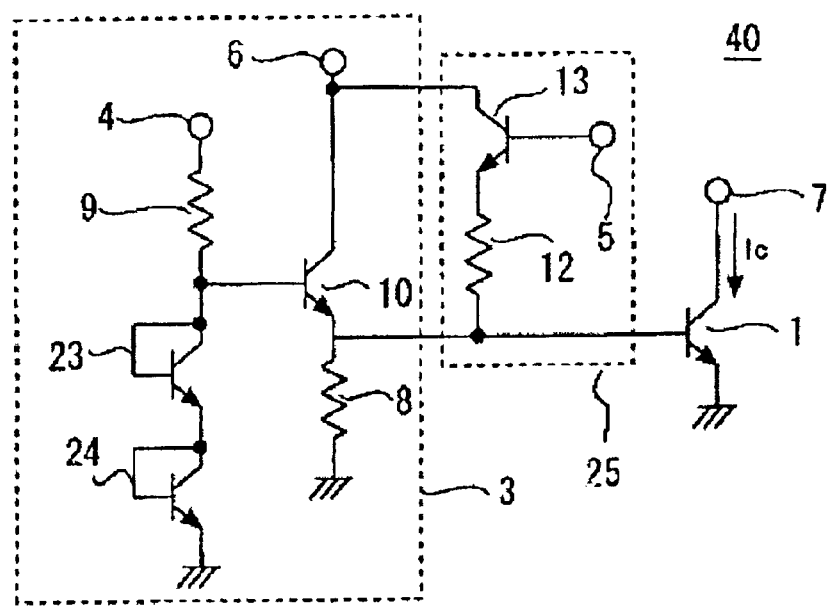
FIG. 2 shows a power amplifier according to a second embodiment of the invention.

FIG. 2 shows a power amplifier 40 according to a second embodiment of the invention. Components in FIG. 2 having the same components in FIG. 1 are given the same reference numerals as the latter and will not be described. The power amplifier 40 of FIG. 2 is different from the power amplifier 30 of FIG. 1 in the following points. A transistor Q2 (13) is newly provided. The base of the transistor Q2 (13) is connected to the reference voltage terminal 5 that supplies the reference voltage Vref. The collector of the transistor Q2 (13) is connected to the terminal 6 of the bias circuit voltage source Vcb. The emitter of the transistor Q2 (13) is connected to the base of the RF transistor 1 via the resistor R3 (12).

The operation of the amplifier 40 of FIG. 2 is basically the same as the amplifier 30 of FIG. 1. When the amplifier 40 is in high output power operation, the bias switching MOD terminal 4 is given an on-voltage (3 V) and hence the bias circuit unit 3 outputs a base bias for the RF transistor 1. As in the case of the amplifier 30, the RF transistor 1 of the amplifier 40 performs a constant voltage operation based on the bias that is output from the bias circuit unit 3. When the amplifier 40 is in low output power operation, the bias switching MOD terminal 4 is given an off-voltage (0 V) and hence no bias voltage to be supplied to the base of the RF transistor 1 is output from the bias circuit unit 3. Since the bias circuit unit 3 of the amplifier 40 does not operate as in the case of the amplifier 30, the efficiency of the amplifier 40 is increased. The base bias for the RF transistor 1 is supplied from the reference voltage terminal 5 via the transistor Q2 (13) and the resistor R3 (12). At this time, the current flowing through the reference voltage terminal 5 can be decreased to $1/\beta$ of the current flowing through the transistor Q2 (13), where $\beta$ is the current gain of transistor Q2 (13). The RF transistor 1 of the amplifier 40 performs a constant current operation like the amplifier 30 according to the first embodiment and the base bias is supplied to the RF transistor 1 irrespective of a variation in the bias of the bias circuit unit 3. Therefore, a variation in the idle current of the RF transistor 1 can be suppressed.

As described above, according to the second embodiment, the transistor Q2 (13) can newly be provided unlike the case of the first embodiment. The base of the transistor Q2 (13) is connected to the reference voltage terminal 5 that supplies the reference voltage Vref. The collector of the transistor Q2

(13) is connected to the terminal 6 of the bias circuit voltage source Vcb. The emitter of the transistor Q2 (13) is connected to the base of the RF transistor 1 via the resistor R3 (12). This amplifier 40 provides, in addition to the advantages of the amplifier 30 according to the first embodiment, an advantage that the current flowing through the reference voltage terminal 5 can be decreased to 1/β of the current flowing through the transistor Q2 (13), where β is the current gain of transistor Q2 (13).

Third Embodiment

Figure 3:
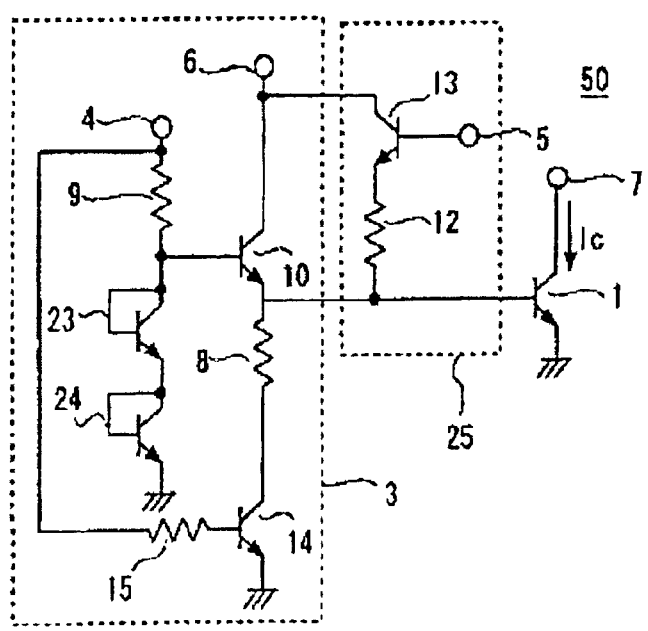
FIG. 3 shows a power amplifier according to a third embodiment of the invention.
Figure 4:
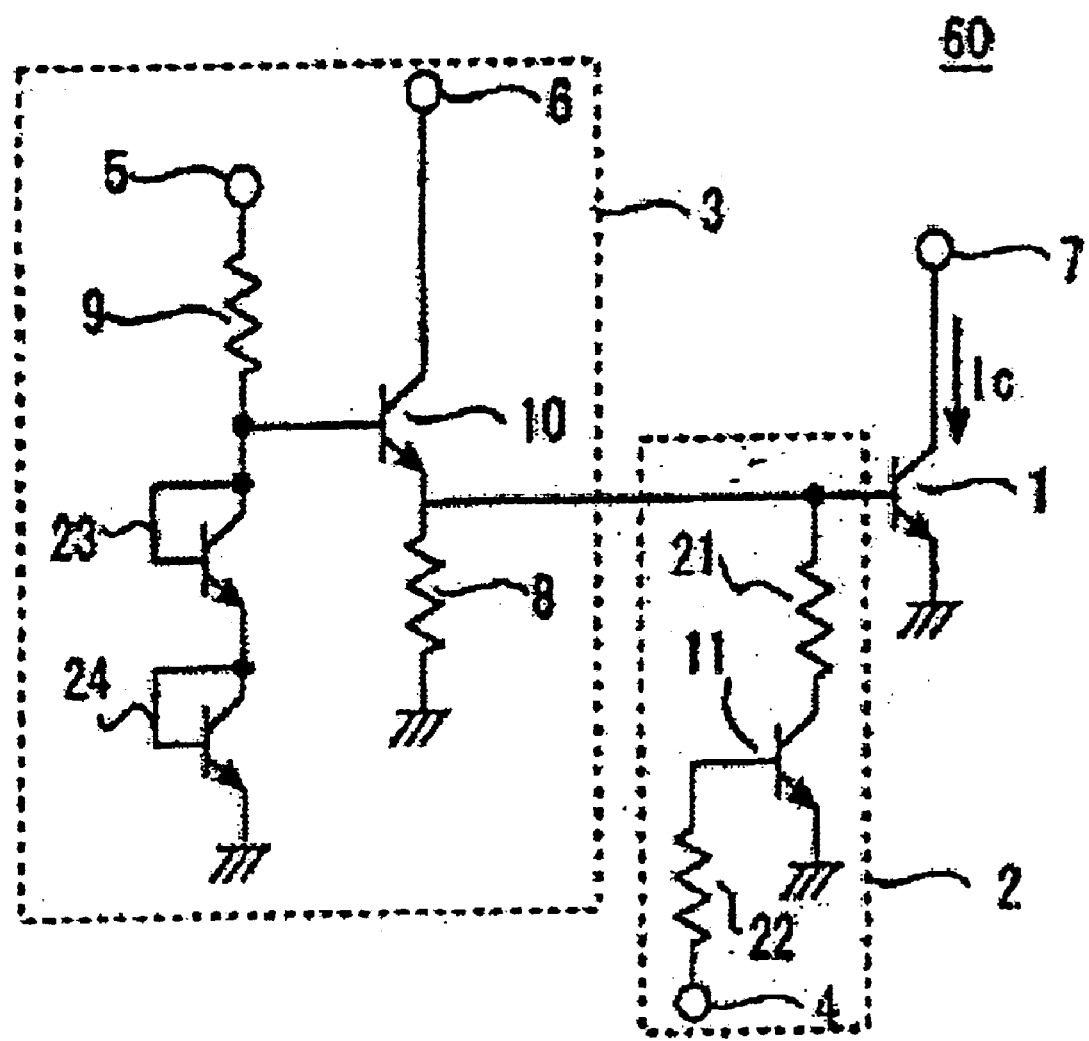
FIG. 4 shows a conventional power amplifier with a bias circuit having a bias setting switching function.

FIG. 3 shows a power amplifier 50 according to a third embodiment of the invention. Components in FIG. 3 having the same components in FIG. 2 are given the same reference numerals as the latter and will not be described. The power amplifier 50 of FIG. 3 is different from the power amplifier 40 of FIG. 2 in the following points. Where the bias circuit unit 3 of the power amplifier 40 is formed as an emitter follower, a new transistor Q3 (14) is provided. The collector of the transistor Q3 (14) is connected to the ground GND side of the resistor R1 (8). The base of the transistor Q3 (14) is connected to the bias switching MOD terminal 4 via a new resistor R4 (15). The emitter of the transistor Q3 (14) is connected to the ground GND.

The operation of the amplifier 50 of FIG. 3 is basically the same as the amplifier 40 of FIG. 2. When the amplifier 50 is in high output power operation, the bias switching MOD terminal 4 is given an on-voltage (3 V) and the transistor Q1 (10) is turned on. This allows current to flow through the resistor R1 (8) and hence the bias circuit unit 3 outputs a base bias for the RF transistor 1. As in the case of the amplifier 40, the RF transistor 1 of the amplifier 50 performs a constant voltage operation based on the base bias that is output from the bias circuit unit 3. When the amplifier 50 is in low output power operation, the bias switching MOD terminal 4 is given an off-voltage (0 V), turning off the transistor Q1 (10) and hence the bias circuit unit 3 does not operate. Since the bias switching MOD terminal 4 is connected to the transistor Q3 (14) via the resistor R4 (15), no current flows through the resistor R1 (8) and hence the efficiency of the amplifier 50 can be increased. The base bias for the RF transistor 1 is determined by the reference voltage Vref and the resistor R3 (12). As in the case of the amplifier 40, the current flowing through the reference voltage terminal 5 can be decreased to 1/β of the current flowing through the transistor Q2 (13), where P is the current gain of transistor Q2 (13). The RF transistor 1 of the amplifier 50 performs a constant current operation and the base bias is supplied to the RF transistor 1 irrespective of a variation in the bias of the bias circuit unit 3. Therefore, a variation in the idle current of the RF transistor 1 can be suppressed.

As described above, according to the third embodiment, the transistor Q3 (14) can newly be provided unlike the case of the second embodiment. The collector of the transistor Q3 (14) is connected to the ground GND side of the resistor R1 (8). The base of the transistor Q3 (14) is connected to the bias switching MOD terminal 4 via the new resistor R4 (15). The emitter of the transistor Q3 (14) is connected to the ground GND. This amplifier 50 provides, in addition to the advantages of the amplifier 40 according to the second embodiment, an advantage that a current is prevented from flowing through the resistor R1 (8) when the bias circuit unit 3 does not operate. This makes it possible to further decrease the current consumption and hence to further increase the efficiency of the amplifier 50.

Each of the above first to third embodiments is directed to the case that the RF transistor 1 is of one stage. However, the invention can also be applied to a multi-stage amplifier.

Figure 5:
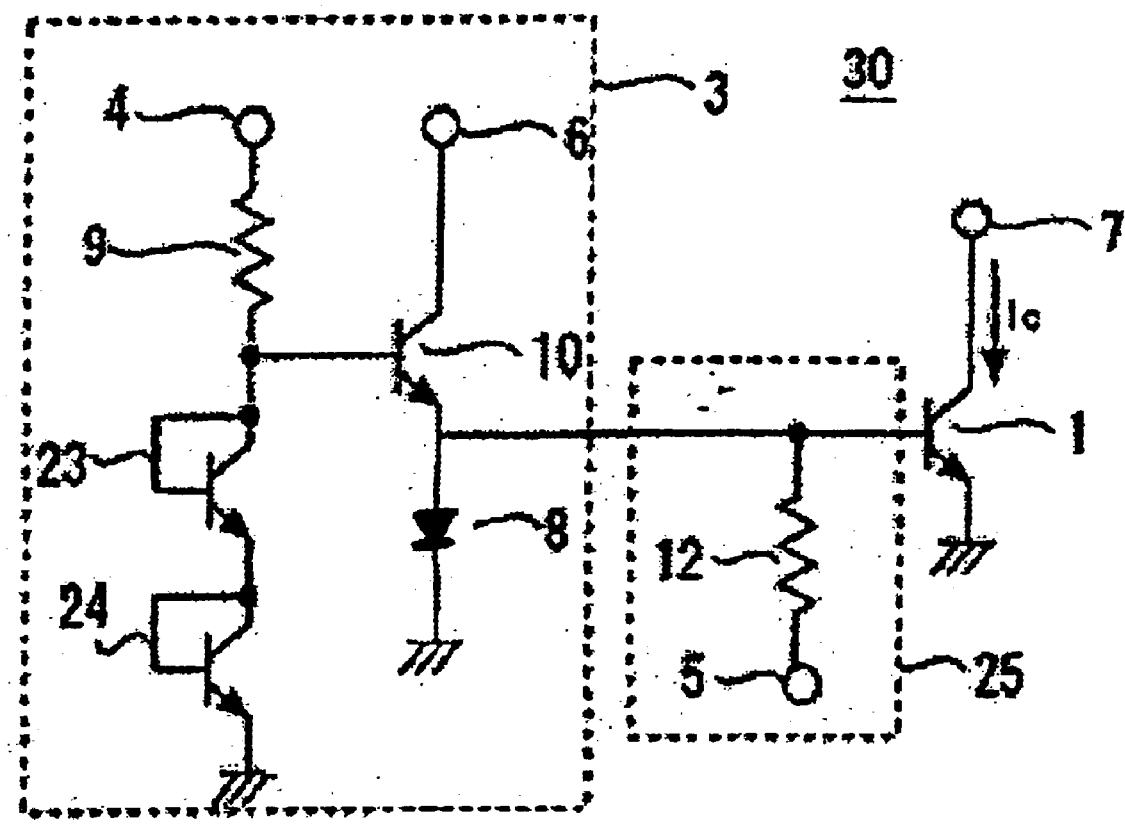
FIG. 5 shows a power amplifier according to another embodiment of the invention.

Although the bias circuit unit 3 has the emitter follower configuration, the same advantages can be obtained even if the resistor R1 (8) is replaced by a diode 19 as shown in FIG. 5. With regard to the form of implementation of the amplifier, the same advantages can be obtained by forming a radio-frequency integrated device in which the bias circuit unit 3 is formed either in the same chip or a separate chip. That is, the RF transistor 1, the reference voltage supply unit 25, and the bias circuit unit 3 may be formed in the same chip. Alternatively, the bias circuit unit 3 may be formed in a different chip from the RF transistor 1 and the reference voltage supply unit 25.

The features and advantages of the present invention may be summarized as follows.

As described above, in the radio-frequency amplifier according to the invention, the base biases that are supplied to the RF transistor when it is in high output power operation and in low output power operation, respectively, are supplied from different voltage sources. This makes it possible to suppress a variation in the idle current of the RF transistor 1 and to increase the efficiency of the amplifier.

Obviously many modifications and variations of the present invention are possible in the light of the above teachings. It is therefore to be understood that within the scope of the appended claims the invention may by practiced otherwise than as specifically described. The entire disclosure of a Japanese Patent Application No. 2002-195075, filed on Jul. 3, 2002 including specification, claims, drawings and summary, on which the Convention priority of the present application is based, are incorporated herein by reference in its entirety.

What is claimed is:

1. A radio-frequency amplifier for amplifying a radio-frequency signal, comprising:
    a radio-frequency transistor having a base;
    a reference voltage supply unit for supplying a first base bias from a reference voltage source to a base of the radio-frequency transistor via a first resistor; and
    a bias circuit unit for outputting a second base bias to the base of the radio-frequency transistor, wherein
        the bias circuit unit comprises a switching terminal that provides a signal that switches output of the second base bias on and off,
        the radio-frequency transistor operates at a constant voltage and the radio-frequency amplifier produces a first output power when the bias circuit unit outputs the second base bias, and
        the radio-frequency transistor operates at a constant current and the radio-frequency amplifier produces a second output power, lower than the first output power when the bias circuit unit does not output the second base bias.

2. The radio-frequency amplifier according to claim 1, wherein the second base bias is larger than the first base bias.

3. The radio-frequency amplifier according to claim 1, wherein the bias circuit unit comprises a voltage source terminal, a first transistor having a collector that is connected to the voltage source terminal, a base that is connected to the switching terminal, and an emitter that is connected to the base of the radio-frequency transistor, and a second resistor that is connected to the first emitter of the first transistor.

4. The radio-frequency amplifier according to claim 3, wherein the reference voltage supply unit comprises a second transistor having a base that is connected to the reference voltage source, a collector that is connected to the voltage source terminal, and an emitter that is connected to the base of the radio-frequency transistor via the first resistor.

5. The radio-frequency amplifier according to claim 3, wherein the bias circuit unit further comprises a second transistor that is provided between the second resistor and a ground and that has a collector that is connected to the second resistor, a base that is connected to the switching terminal via a third resistor, and a grounded emitter.

6. A radio-frequency amplifier for amplifying a radio-frequency signal comprising:

a radio-frequency transistor having a base;

a reference voltage supply unit for supplying a first base bias from a reference voltage source to the base of the radio-frequency transistor via a first resistor; and a bias circuit unit for outputting a second base bias to the base of the radio-frequency transistor, wherein the bias circuit unit comprises a switching terminal that provides a signal that switches output of the second base bias on and off, a voltage source terminal, a first transistor having a collector that is connected to the voltage source terminal, a base that is connected to the switching terminal, and an emitter that is connected to the base of the radio-frequency transistor, and a diode that is connected to the emitter of the first transistor, the radio-frequency transistor operates at a constant voltage and the radio-frequency amplifier produces a first output power when the bias circuit unit outputs the second base bias, and the radio-frequency transistor operates at a constant current and the radio-frequency amplifier produces a second output power, lower than the first output power when the bias circuit unit does not output the second base bias.

* * * * *